(12) United States Patent
Schroeder et al.

(10) Patent No.: US 10,451,322 B2
(45) Date of Patent: Oct. 22, 2019

(54) REFRIGERATOR APPLIANCE WITH A CALORIC HEAT PUMP

(71) Applicant: Haier US Appliance Solutions, Inc., Wilmington, DE (US)

(72) Inventors: Michael Goodman Schroeder, Louisville, KY (US); Michael Alexander Benedict, Louisville, KY (US)

(73) Assignee: Haier US Appliance Solutions, Inc., Wilmington, DE (US)

( * ) Notice: Subject to any disclaimer, the term of this patent is extended or adjusted under 35 U.S.C. 154(b) by 146 days.

(21) Appl. No.: 15/653,944

(22) Filed: Jul. 19, 2017

(65) Prior Publication Data

US 2019/0024955 A1    Jan. 24, 2019

(51) Int. Cl.
*F25B 21/00* (2006.01)
*F25D 23/06* (2006.01)
*F25D 11/02* (2006.01)
*F25D 13/04* (2006.01)
*H01F 1/01* (2006.01)
(Continued)

(52) U.S. Cl.
CPC ................. *F25B 30/02* (2013.01); *F25B 9/14* (2013.01); *F25B 21/00* (2013.01); *F25D 23/003* (2013.01); *F25D 23/006* (2013.01); *H01L 35/30* (2013.01); *F25B 25/00* (2013.01); *F25B 27/00* (2013.01);
(Continued)

(58) Field of Classification Search
CPC .......... H01F 1/012; H01F 1/017; F25B 21/00; F25B 2309/1415; F25B 29/00; F25D 21/04; F25D 21/12; F25D 21/125; F25D 23/066; F25D 23/068; F25D 2321/1412;
(Continued)

(56) References Cited

U.S. PATENT DOCUMENTS 668,560 A    2/1901   Fulner et al.
1,985,455 A  12/1934  Mosby
(Continued)

FOREIGN PATENT DOCUMENTS

CA    2893874 A1    6/2014
CA    2919117 A1    1/2015
(Continued)

OTHER PUBLICATIONS

International Search Report issued in connection with PCT Application No. PCT/US2014/042485 dated Oct. 23, 2014.
(Continued)

*Primary Examiner* — Frantz F Jules
*Assistant Examiner* — Erik Mendoza-Wilkenfel
(74) *Attorney, Agent, or Firm* — Dority & Manning, P.A.

(57) ABSTRACT

A refrigerator appliance includes a cold side working fluid circuit that couples a cold side heat exchanger and a regenerator housing. A first hot side working fluid circuit couples a first hot side heat exchanger and the regenerator housing. A second hot side working fluid circuit couples a second hot side heat exchanger and the regenerator housing such that working fluid is flowable between the second hot side heat exchanger and the regenerator housing. An inlet of the second hot side working fluid circuit is positioned on the regenerator housing such that a temperature of the working fluid at the inlet of the second hot side working fluid circuit is greater than a temperature of the chilled chamber.

14 Claims, 6 Drawing Sheets

(51) Int. Cl.
  *F25B 29/00* (2006.01)
  *F25B 30/02* (2006.01)
  *F25B 9/14* (2006.01)
  *F25D 23/00* (2006.01)
  *H01L 35/30* (2006.01)
  *F25D 11/00* (2006.01)
  *F25B 25/00* (2006.01)
  *F25B 27/00* (2006.01)

(52) U.S. Cl.
  CPC ......... *F25B 2321/002* (2013.01); *F25D 11/00* (2013.01)

(58) Field of Classification Search
  CPC ...... F25D 11/022; F25D 11/025; F25D 13/04; F25D 31/0005
  See application file for complete search history.

(56) References Cited

U.S. PATENT DOCUMENTS

| | | |
|---|---|---|
| 2,671,929 A | 3/1954 | Gayler |
| 2,765,633 A | 10/1956 | Muffly |
| 3,816,029 A | 6/1974 | Bowen et al. |
| 3,956,076 A | 5/1976 | Powell, Jr. et al. |
| 4,037,427 A | 7/1977 | Kramer |
| 4,102,655 A | 7/1978 | Jeffery et al. |
| 4,107,935 A | 8/1978 | Steyert, Jr. |
| 4,197,709 A | 4/1980 | Hochstein |
| 4,200,680 A | 4/1980 | Sasazawa et al. |
| 4,259,843 A | 4/1981 | Kausch |
| 4,507,927 A | 4/1985 | Barclay |
| 4,507,928 A | 4/1985 | Johnson |
| 4,549,155 A | 10/1985 | Halbach |
| 4,554,790 A | 11/1985 | Nakagome et al. |
| 4,557,228 A | 12/1985 | Samodovitz |
| 4,599,866 A | 7/1986 | Nakagome et al. |
| 4,625,519 A | 12/1986 | Hakuraku et al. |
| 4,642,994 A | 2/1987 | Barclay et al. |
| 4,735,062 A * | 4/1988 | Woolley ............... F25D 23/062 312/296 |
| 4,741,175 A | 5/1988 | Schulze |
| 4,785,636 A | 11/1988 | Hakuraku et al. |
| 4,796,430 A | 1/1989 | Malaker et al. |
| 5,091,361 A | 2/1992 | Hed |
| 5,156,003 A | 10/1992 | Yoshiro et al. |
| 5,249,424 A | 10/1993 | DeGregoria et al. |
| 5,336,421 A | 8/1994 | Kurita et al. |
| 5,351,791 A | 10/1994 | Rosenzweig |
| 5,465,781 A | 11/1995 | DeGregoria |
| 5,599,177 A | 2/1997 | Hetherington |
| 5,661,895 A | 9/1997 | Irgens |
| 5,718,570 A | 2/1998 | Beckett et al. |
| 5,934,078 A | 8/1999 | Lawton, Jr. et al. |
| 6,332,323 B1 | 12/2001 | Reid et al. |
| 6,423,255 B1 | 7/2002 | Hoechsmann et al. |
| 6,446,441 B1 | 9/2002 | Dean |
| 6,467,274 B2 | 10/2002 | Barclay et al. |
| 6,526,759 B2 | 3/2003 | Zimm et al. |
| 6,588,215 B1 | 7/2003 | Ghoshal |
| 6,612,816 B1 | 9/2003 | Vanden Brande et al. |
| 6,668,560 B2 | 12/2003 | Zimm et al. |
| 6,826,915 B2 | 12/2004 | Wada et al. |
| 6,915,647 B2 | 7/2005 | Tsuchikawa et al. |
| 6,935,121 B2 | 8/2005 | Fang et al. |
| 6,946,941 B2 | 9/2005 | Chell |
| 6,971,245 B2 | 12/2005 | Kuroyanagi |
| 7,148,777 B2 | 12/2006 | Chell et al. |
| 7,297,270 B2 | 11/2007 | Bernard et al. |
| 7,313,926 B2 | 1/2008 | Gurin |
| 7,481,064 B2 | 1/2009 | Kitanovski et al. |
| 7,552,592 B2 | 6/2009 | Iwasaki et al. |
| 7,644,588 B2 | 1/2010 | Shin et al. |
| 7,863,789 B2 | 1/2011 | Zepp et al. |
| 7,897,898 B2 | 3/2011 | Muller et al. |
| 7,938,632 B2 | 5/2011 | Smith |
| 8,061,147 B2 | 11/2011 | Dinesen et al. |
| 8,069,662 B1 | 12/2011 | Albert |
| 8,099,964 B2 | 1/2012 | Saito et al. |
| 8,174,245 B2 | 5/2012 | Carver |
| 8,191,375 B2 | 6/2012 | Sari et al. |
| 8,209,988 B2 | 7/2012 | Zhang et al. |
| 8,216,396 B2 | 7/2012 | Dooley et al. |
| 8,310,325 B2 | 11/2012 | Zhang et al. |
| 8,375,727 B2 | 2/2013 | Sohn |
| 8,378,769 B2 | 2/2013 | Heitzler et al. |
| 8,448,453 B2 | 5/2013 | Bahl et al. |
| 8,551,210 B2 | 10/2013 | Reppel et al. |
| 8,596,084 B2 | 12/2013 | Herrera et al. |
| 8,616,009 B2 | 12/2013 | Dinesen et al. |
| 8,656,725 B2 | 2/2014 | Muller et al. |
| 8,695,354 B2 | 4/2014 | Heitzler et al. |
| 8,729,718 B2 | 5/2014 | Kuo et al. |
| 8,763,407 B2 | 7/2014 | Carroll et al. |
| 8,769,966 B2 | 7/2014 | Heitzler et al. |
| 8,869,541 B2 | 10/2014 | Heitzler et al. |
| 8,904,806 B2 | 12/2014 | Cramet et al. |
| 8,935,927 B2 | 1/2015 | Kobayashi et al. |
| 9,175,885 B2 | 11/2015 | Katter |
| 9,245,673 B2 | 1/2016 | Carroll et al. |
| 9,377,221 B2 | 6/2016 | Benedict |
| 9,400,126 B2 | 7/2016 | Takahashi et al. |
| 9,523,519 B2 | 12/2016 | Muller |
| 9,534,817 B2 | 1/2017 | Benedict et al. |
| 9,548,151 B2 | 1/2017 | Muller |
| 9,599,374 B2 | 3/2017 | Takahashi et al. |
| 9,631,843 B2 | 4/2017 | Benedict |
| 9,702,594 B2 | 7/2017 | Vetrovec |
| 9,739,510 B2 | 8/2017 | Hassen |
| 9,797,630 B2 | 10/2017 | Benedict et al. |
| 9,810,454 B2 | 11/2017 | Tasaki et al. |
| 9,857,105 B1 | 1/2018 | Schroeder et al. |
| 9,857,106 B1 | 1/2018 | Schroeder et al. |
| 9,927,155 B2 | 3/2018 | Boeder et al. |
| 9,978,487 B2 | 5/2018 | Katter et al. |
| 10,006,675 B2 | 6/2018 | Benedict et al. |
| 10,018,385 B2 | 7/2018 | Radermacher et al. |
| 2002/0040583 A1 | 4/2002 | Barclay et al. |
| 2002/0066368 A1 | 6/2002 | Zornes |
| 2003/0010054 A1 | 1/2003 | Esch et al. |
| 2003/0051774 A1 | 3/2003 | Saito |
| 2004/0093877 A1 | 5/2004 | Wada |
| 2004/0182086 A1 | 9/2004 | Chiang et al. |
| 2004/0187510 A1 | 9/2004 | Jung |
| 2004/0187803 A1 | 9/2004 | Regev |
| 2004/0250550 A1 | 12/2004 | Bruck |
| 2005/0109490 A1 | 5/2005 | Harmon et al. |
| 2005/0274676 A1 | 12/2005 | Kumar et al. |
| 2006/0130518 A1 | 6/2006 | Kang et al. |
| 2006/0231163 A1 | 10/2006 | Hirosawa et al. |
| 2007/0130960 A1 | 6/2007 | Muller et al. |
| 2007/0220901 A1 | 9/2007 | Kobayashi |
| 2008/0236171 A1 | 10/2008 | Saito et al. |
| 2008/0236175 A1 | 10/2008 | Chaparro Monferrer et al. |
| 2008/0303375 A1 | 12/2008 | Carver |
| 2009/0091411 A1 | 4/2009 | Zhang et al. |
| 2009/0158749 A1 | 6/2009 | Sandeman |
| 2009/0217674 A1 | 9/2009 | Kaji et al. |
| 2009/0236930 A1 | 9/2009 | Nashiki |
| 2009/0266083 A1 | 10/2009 | Shin et al. |
| 2009/0308080 A1 | 12/2009 | Han et al. |
| 2010/0000228 A1 | 1/2010 | Wiest et al. |
| 2010/0058775 A1 | 3/2010 | Kaji et al. |
| 2010/0071383 A1 | 3/2010 | Zhang et al. |
| 2010/0116471 A1 | 5/2010 | Reppel |
| 2010/0122488 A1 | 5/2010 | Fukai |
| 2010/0162747 A1* | 7/2010 | Hamel ................ F25D 11/022 62/441 |
| 2010/0209084 A1 | 8/2010 | Nelson et al. |
| 2010/0236258 A1 | 9/2010 | Heitzler et al. |
| 2010/0276627 A1 | 11/2010 | Mazet |
| 2010/0303917 A1 | 12/2010 | Watson et al. |
| 2011/0000206 A1 | 1/2011 | Aprad |
| 2011/0042608 A1 | 2/2011 | Reesink |

(56) References Cited

U.S. PATENT DOCUMENTS

| | | |
|---|---|---|
| 2011/0048031 A1 | 3/2011 | Barve |
| 2011/0048690 A1 | 3/2011 | Reppel et al. |
| 2011/0058795 A1 | 3/2011 | Kleman et al. |
| 2011/0061398 A1 | 3/2011 | Shih et al. |
| 2011/0062821 A1 | 3/2011 | Chang et al. |
| 2011/0082026 A1 | 4/2011 | Sakatani et al. |
| 2011/0162388 A1 | 7/2011 | Barve et al. |
| 2011/0168363 A9 | 7/2011 | Reppel et al. |
| 2011/0173993 A1 | 7/2011 | Muller et al. |
| 2011/0182086 A1 | 7/2011 | Mienko et al. |
| 2011/0192836 A1 | 8/2011 | Muller et al. |
| 2011/0218921 A1 | 9/2011 | Addala et al. |
| 2011/0239662 A1 | 10/2011 | Bahl et al. |
| 2011/0284196 A1 | 11/2011 | Zanadi |
| 2011/0302931 A1 | 12/2011 | Sohn |
| 2011/0308258 A1 | 12/2011 | Smith et al. |
| 2011/0314836 A1* | 12/2011 | Heitzler ............... F25B 21/00 62/3.1 |
| 2012/0031108 A1 | 2/2012 | Kobayashi et al. |
| 2012/0033002 A1 | 2/2012 | Seeler et al. |
| 2012/0036868 A1 | 2/2012 | Heitzler et al. |
| 2012/0045698 A1 | 2/2012 | Shima |
| 2012/0079834 A1 | 4/2012 | Dinesen |
| 2012/0222427 A1 | 9/2012 | Hassen |
| 2012/0222428 A1 | 9/2012 | Celik et al. |
| 2012/0266591 A1 | 10/2012 | Morimoto et al. |
| 2012/0266607 A1 | 10/2012 | Morimoto et al. |
| 2012/0267090 A1 | 10/2012 | Kruglick |
| 2012/0272665 A1 | 11/2012 | Watanabe et al. |
| 2012/0272666 A1 | 11/2012 | Watanabe |
| 2012/0285179 A1 | 11/2012 | Morimoto |
| 2012/0291453 A1 | 11/2012 | Watanabe et al. |
| 2013/0019610 A1 | 1/2013 | Zimm et al. |
| 2013/0020529 A1 | 1/2013 | Chang et al. |
| 2013/0104568 A1 | 5/2013 | Kuo et al. |
| 2013/0106116 A1 | 5/2013 | Kuo et al. |
| 2013/0145573 A1 | 6/2013 | Bizhanzadeh |
| 2013/0180263 A1 | 7/2013 | Choi et al. |
| 2013/0186107 A1 | 7/2013 | Shih et al. |
| 2013/0187077 A1 | 7/2013 | Katter |
| 2013/0192269 A1 | 8/2013 | Wang |
| 2013/0199460 A1 | 8/2013 | Duplessis et al. |
| 2013/0227965 A1 | 9/2013 | Yagi et al. |
| 2013/0232993 A1 | 9/2013 | Saito et al. |
| 2013/0255279 A1 | 10/2013 | Tomimatsu et al. |
| 2013/0269367 A1 | 10/2013 | Meillan |
| 2013/0298571 A1 | 11/2013 | Morimoto et al. |
| 2013/0300243 A1 | 11/2013 | Gieras et al. |
| 2013/0319012 A1 | 12/2013 | Kuo et al. |
| 2013/0327062 A1 | 12/2013 | Watanabe et al. |
| 2014/0020881 A1 | 1/2014 | Reppel et al. |
| 2014/0075958 A1 | 3/2014 | Takahashi et al. |
| 2014/0116538 A1 | 5/2014 | Tanaka et al. |
| 2014/0165594 A1 | 6/2014 | Benedict |
| 2014/0165595 A1* | 6/2014 | Zimm ............... F25B 21/00 62/3.1 |
| 2014/0190182 A1 | 7/2014 | Benedict |
| 2014/0216057 A1 | 8/2014 | Oezcan |
| 2014/0260373 A1 | 9/2014 | Gerber et al. |
| 2014/0290273 A1 | 10/2014 | Benedict et al. |
| 2014/0290275 A1 | 10/2014 | Muller |
| 2014/0291570 A1 | 10/2014 | Klausner et al. |
| 2014/0305137 A1 | 10/2014 | Benedict |
| 2014/0305139 A1 | 10/2014 | Takahashi et al. |
| 2014/0325996 A1 | 11/2014 | Muller |
| 2014/0366557 A1 | 12/2014 | Mun et al. |
| 2015/0007582 A1 | 1/2015 | Kim et al. |
| 2015/0027133 A1 | 1/2015 | Benedict |
| 2015/0030483 A1 | 1/2015 | Ryu |
| 2015/0033762 A1 | 2/2015 | Cheng et al. |
| 2015/0033763 A1 | 2/2015 | Saito et al. |
| 2015/0047371 A1 | 2/2015 | Hu et al. |
| 2015/0068219 A1 | 3/2015 | Komorowski et al. |
| 2015/0089960 A1 | 4/2015 | Takahashi et al. |
| 2015/0114007 A1 | 4/2015 | Neilson et al. |
| 2015/0168030 A1 | 6/2015 | Leonard et al. |
| 2015/0211440 A1 | 7/2015 | Joffroy |
| 2015/0260433 A1 | 9/2015 | Choi et al. |
| 2015/0267943 A1 | 9/2015 | Kim et al. |
| 2015/0362225 A1 | 12/2015 | Schwartz |
| 2015/0369524 A1 | 12/2015 | Ikegami et al. |
| 2016/0000999 A1 | 1/2016 | Focht et al. |
| 2016/0084544 A1 | 3/2016 | Radermacher et al. |
| 2016/0091227 A1 | 3/2016 | Leonard et al. |
| 2016/0216012 A1* | 7/2016 | Benedict ............... F25B 21/00 |
| 2016/0238287 A1 | 8/2016 | Benedict |
| 2016/0282021 A1 | 9/2016 | Zhao et al. |
| 2016/0355898 A1 | 12/2016 | Vieyra Villegas et al. |
| 2016/0356529 A1 | 12/2016 | Humburg |
| 2016/0367982 A1 | 12/2016 | Pennie |
| 2017/0059213 A1 | 3/2017 | Barclay et al. |
| 2017/0071234 A1 | 3/2017 | Garg |
| 2017/0138648 A1 | 5/2017 | Cui et al. |
| 2017/0176083 A1 | 6/2017 | Sul et al. |
| 2017/0328603 A1 | 11/2017 | Barclay et al. |
| 2017/0328649 A1 | 11/2017 | Brandmeier |
| 2017/0370624 A1 | 12/2017 | Zimm et al. |
| 2018/0005735 A1 | 1/2018 | Scharf et al. |
| 2018/0023852 A1 | 1/2018 | Schroeder et al. |

FOREIGN PATENT DOCUMENTS

| | | |
|---|---|---|
| CN | 101979937 A | 2/2011 |
| CN | 201772566 U | 3/2011 |
| CN | 101788207 B | 9/2011 |
| CN | 202432596 U | 9/2012 |
| CN | 103090583 A | 5/2013 |
| CN | 103712401 A | 4/2014 |
| CN | 102077303 B | 4/2015 |
| CN | 106481842 A | 3/2017 |
| DE | 102013223959 A1 | 5/2015 |
| DE | 202015106851 U1 | 3/2016 |
| EP | 0187078 A1 | 7/1986 |
| EP | 2071255 A1 | 6/2009 |
| EP | 2108904 A1 | 10/2009 |
| EP | 2215955 A1 | 8/2010 |
| EP | 2322072 A2 | 5/2011 |
| EP | 3306082 A2 | 4/2018 |
| FR | 2935468 A1 | 3/2010 |
| JP | 59232922 | 12/1984 |
| JP | H08166182 A | 6/1996 |
| JP | 3205196 B2 | 9/2001 |
| JP | 2002315243 A | 10/2002 |
| JP | 2007147136 A | 6/2007 |
| JP | 2007291437 A | 11/2007 |
| JP | 2008051412 A | 3/2008 |
| JP | 2010112606 A | 5/2010 |
| JP | 2010525291 A | 7/2010 |
| JP | 6212955 B2 | 12/2014 |
| JP | 2014228216 A | 12/2014 |
| JP | 6079498 B2 | 2/2017 |
| JP | 2017207222 A | 11/2017 |
| KR | 101100301 B1 | 12/2011 |
| KR | 1238234 B1 | 3/2012 |
| WO | WO 0212800 A1 | 2/2002 |
| WO | WO 03016794 A1 | 2/2003 |
| WO | WO 2004/068512 | 8/2004 |
| WO | WO 2007/036729 A1 | 4/2007 |
| WO | WO 2009/024412 | 2/2009 |
| WO | WO2010/119591 A1 | 10/2010 |
| WO | WO 2011034594 A1 | 3/2011 |
| WO | WO 2014099199 A1 | 6/2014 |
| WO | WO 2014170447 A1 | 10/2014 |
| WO | WO 2014173787 A1 | 10/2014 |
| WO | WO 2015017230 A1 | 2/2015 |
| WO | WO2016035267 A1 | 3/2016 |
| WO | WO 2017042266 A1 | 3/2017 |
| WO | WO2017097989 A1 | 6/2017 |

OTHER PUBLICATIONS

International Search Report issued in connection with PCT Application No. PCT/US2014/017431 dated May 9, 2014.

(56) References Cited

OTHER PUBLICATIONS

International search report issued in connection with PCT/US2013/070518, dated Jan. 22, 2014.
Tetsuji Okamura, Performance of a room-temperature rotary magnet refrigerator, dated Nov. 28, 2005, Elsevier.
Journal of Alloys and Compounds, copyright 2008 Elsevier B..V. Evaluation of Ni—Mn—In—Si Alloys for Magnetic Refrigerant Application, Rahul Das, A. Perumal and A. Srinivasan, Dept of Physics, Indian Institute of Technology, Oct. 10, 2011.
Effects of annealing on the magnetic entropy change and exchange bias behavior in melt-spun Ni—Mn—In ribbons, X.Z. Zhao, C.C. Hsieh, et al Science Direct, Scripta Materialia 63 (2010).
PCT International Search Report and Written Opinion issued in connection with PCT Application No. PCT/US2013/070023 dated Feb. 27, 2014.
Barbara Pulko, Epoxy-bonded La—Fe—Co—Si magnetocaloric plates, Journal of Magnetism and Magnetic Materials, 375 (2015) 65-73.
International Search Report of PCT/US2014/047925 dated Nov. 10, 2014.
Andrej Kitanovski, Present and future caloric refrigeration and heat-pump technologies, International Journal of Refrigeration, vol. 57, Sep. 2015, pp. 288-298.
C Aprea, et al., An innovative rotary permanent magnet magnetic refrigerator based on AMR cycle, Thermal Energy Systems: Production, Storage, Utilization and the Environment, dated May 2015, Napoli, Italy, pp. 1-5.

\* cited by examiner

REFRIGERATOR APPLIANCE WITH A CALORIC HEAT PUMP

FIELD OF THE INVENTION

The present subject matter relates generally to heat pumps, such as magneto-caloric heat pumps.

BACKGROUND OF THE INVENTION

Conventional refrigeration technology typically utilizes a heat pump that relies on compression and expansion of a fluid refrigerant to receive and reject heat in a cyclic manner so as to effect a desired temperature change or transfer heat energy from one location to another. This cycle can be used to receive heat from a refrigeration compartment and reject such heat to the environment or a location that is external to the compartment. Other applications include air conditioning of residential or commercial structures. A variety of different fluid refrigerants have been developed that can be used with the heat pump in such systems.

While improvements have been made to such heat pump systems that rely on the compression of fluid refrigerant, at best such can still only operate at about forty-five percent or less of the maximum theoretical Carnot cycle efficiency. Also, some fluid refrigerants have been discontinued due to environmental concerns. The range of ambient temperatures over which certain refrigerant-based systems can operate may be impractical for certain locations. Other challenges with heat pumps that use a fluid refrigerant exist as well.

Magneto-caloric materials (MCMs), i.e. materials that exhibit the magneto-caloric effect, provide a potential alternative to fluid refrigerants for heat pump applications. In general, the magnetic moments of MCMs become more ordered under an increasing, externally applied magnetic field and cause the MCMs to generate heat. Conversely, decreasing the externally applied magnetic field allows the magnetic moments of the MCMs to become more disordered and allow the MCMs to absorb heat. Some MCMs exhibit the opposite behavior, i.e. generating heat when the magnetic field is removed (which are sometimes referred to as para-magneto-caloric material but both types are referred to collectively herein as magneto-caloric material or MCM). The theoretical Carnot cycle efficiency of a refrigeration cycle based on an MCMs can be significantly higher than for a comparable refrigeration cycle based on a fluid refrigerant. As such, a heat pump system that can effectively use an MCM would be useful.

Challenges exist to the practical and cost competitive use of an MCM, however. In addition to the development of suitable MCMs, equipment that can attractively utilize an MCM is still needed. Currently proposed equipment may require relatively large and expensive magnets, may be impractical for use in e.g., appliance refrigeration, and may not otherwise operate with enough efficiency to justify capital cost.

Accordingly, a heat pump system that can address certain challenges, such as those identified above, would be useful. Such a heat pump system that can also be used in a refrigerator appliance would also be useful.

BRIEF DESCRIPTION OF THE INVENTION

The present subject matter provides a refrigerator appliance. A cold side working fluid circuit couples a cold side heat exchanger and a regenerator housing. A first hot side working fluid circuit couples a first hot side heat exchanger and the regenerator housing. A second hot side working fluid circuit couples a second hot side heat exchanger and the regenerator housing such that working fluid is flowable between the second hot side heat exchanger and the regenerator housing. An inlet of the second hot side working fluid circuit is positioned on the regenerator housing such that a temperature of the working fluid at the inlet of the second hot side working fluid circuit is greater than a temperature of the chilled chamber. Additional aspects and advantages of the invention will be set forth in part in the following description, or may be apparent from the description, or may be learned through practice of the invention.

In a first exemplary embodiment, a refrigerator appliance is provided. The refrigerator appliance includes a cabinet that defines a chilled chamber. A first hot side heat exchanger is positioned outside of the chilled chamber of the cabinet. The refrigerator appliance also includes a second hot side heat exchanger. A cold side heat exchanger is positioned within the cabinet at the chilled chamber. The chilled chamber is chillable with air from the cold side heat exchanger. The refrigerator appliance further includes a regenerator housing. A caloric material is disposed within the regenerator housing. A cold side working fluid circuit couples the cold side heat exchanger and the regenerator housing such that working fluid is flowable between the cold side heat exchanger and the regenerator housing. A first hot side working fluid circuit couples the first hot side heat exchanger and the regenerator housing such that working fluid is flowable between the first hot side heat exchanger and the regenerator housing. A second hot side working fluid circuit couples the second hot side heat exchanger and the regenerator housing such that working fluid is flowable between the second hot side heat exchanger and the regenerator housing. An inlet of the second hot side working fluid circuit is positioned on the regenerator housing such that a temperature of the working fluid at the inlet of the second hot side working fluid circuit is greater than a temperature of the chilled chamber.

In a second exemplary embodiment, a refrigerator appliance is provided. The refrigerator appliance includes a cabinet that defines a chilled chamber. A first hot side heat exchanger is positioned outside of the chilled chamber of the cabinet. The refrigerator appliance also includes a second hot side heat exchanger and a third hot side heat exchanger. A cold side heat exchanger is positioned within the cabinet at the chilled chamber. The chilled chamber is chillable with air from the cold side heat exchanger. The refrigerator appliance further includes a regenerator housing. A caloric material is disposed within the regenerator housing. A cold side working fluid circuit couples the cold side heat exchanger and the regenerator housing such that working fluid is flowable between the cold side heat exchanger and the regenerator housing. A first hot side working fluid circuit couples the first hot side heat exchanger and the regenerator housing such that working fluid is flowable between the first hot side heat exchanger and the regenerator housing. A second hot side working fluid circuit couples the second hot side heat exchanger and the regenerator housing such that working fluid is flowable between the second hot side heat exchanger and the regenerator housing. An inlet of the second hot side working fluid circuit is positioned on the regenerator housing such that a temperature of the working fluid at the inlet of the second hot side working fluid circuit is greater than a temperature of the chilled chamber. The third hot side heat exchanger is coupled to the first hot side working fluid circuit. The third hot side heat exchanger is positioned at an inner liner of the cabinet.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures.

DETAILED DESCRIPTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

The present subject matter is directed to a caloric heat pump system for heating or cooling an appliance, such as a refrigerator appliance. While described in greater detail below in the context of a magneto-caloric heat pump system, one of skill in the art using the teachings herein will recognize that other suitable caloric materials may be used in a similar manner to heat or cool an appliance, i.e., apply a field, move heat, remove the field, move heat. For example, electro-caloric material heats up and cools down within increasing and decreasing electric fields. As another example, elasto-caloric material heats up and cools down when exposed to increasing and decreasing mechanical strain. As yet another example, baro-caloric material heats up and cools down when exposed to increasing and decreasing pressure. Such materials and other similar caloric materials may be used in place of or in addition to the magneto-caloric material described below to heat or cool liquid/water within an appliance. Thus, caloric material is used broadly herein to encompass materials that undergo heating or cooling when exposed to a changing field from a field generator, where the field generator may be a magnet, an electric field generator, an actuator for applying mechanical stress or pressure, etc.

Figure 1:
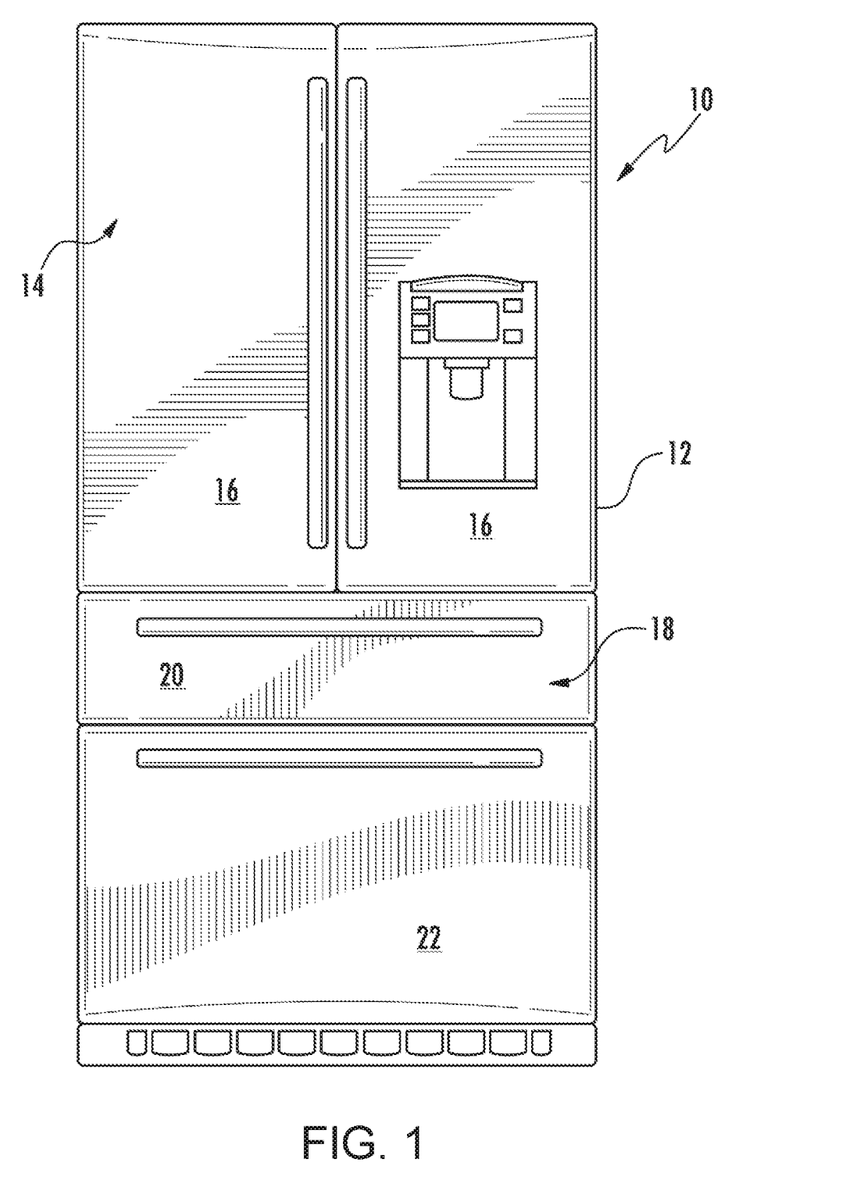
FIG. 1 is a refrigerator appliance in accordance with an example embodiment of the present disclosure.

Referring now to FIG. 1, an example embodiment of a refrigerator appliance 10 is depicted as an upright refrigerator having a cabinet or casing 12 that defines a number of internal storage compartments or chilled chambers. In particular, refrigerator appliance 10 includes upper fresh-food compartments 14 having doors 16 and lower freezer compartment 18 having upper drawer 20 and lower drawer 22. Drawers 20, 22 are "pull-out" type drawers in that they can be manually moved into and out of freezer compartment 18 on suitable slide mechanisms. Refrigerator 10 is provided by way of example only. Other configurations for a refrigerator appliance may be used as well including appliances with only freezer compartments, only chilled compartments, or other combinations thereof different from that shown in FIG. 1. In addition, the heat pump and heat pump system of the present disclosure is not limited to refrigerator appliances and may be used in other applications as well such as e.g., air-conditioning, electronics cooling devices, and others. Thus, it should be understood that while the use of a heat pump and heat pump system to provide cooling within a refrigerator is provided by way of example herein, the present disclosure may also be used to provide for heating applications as well.

Figure 2:
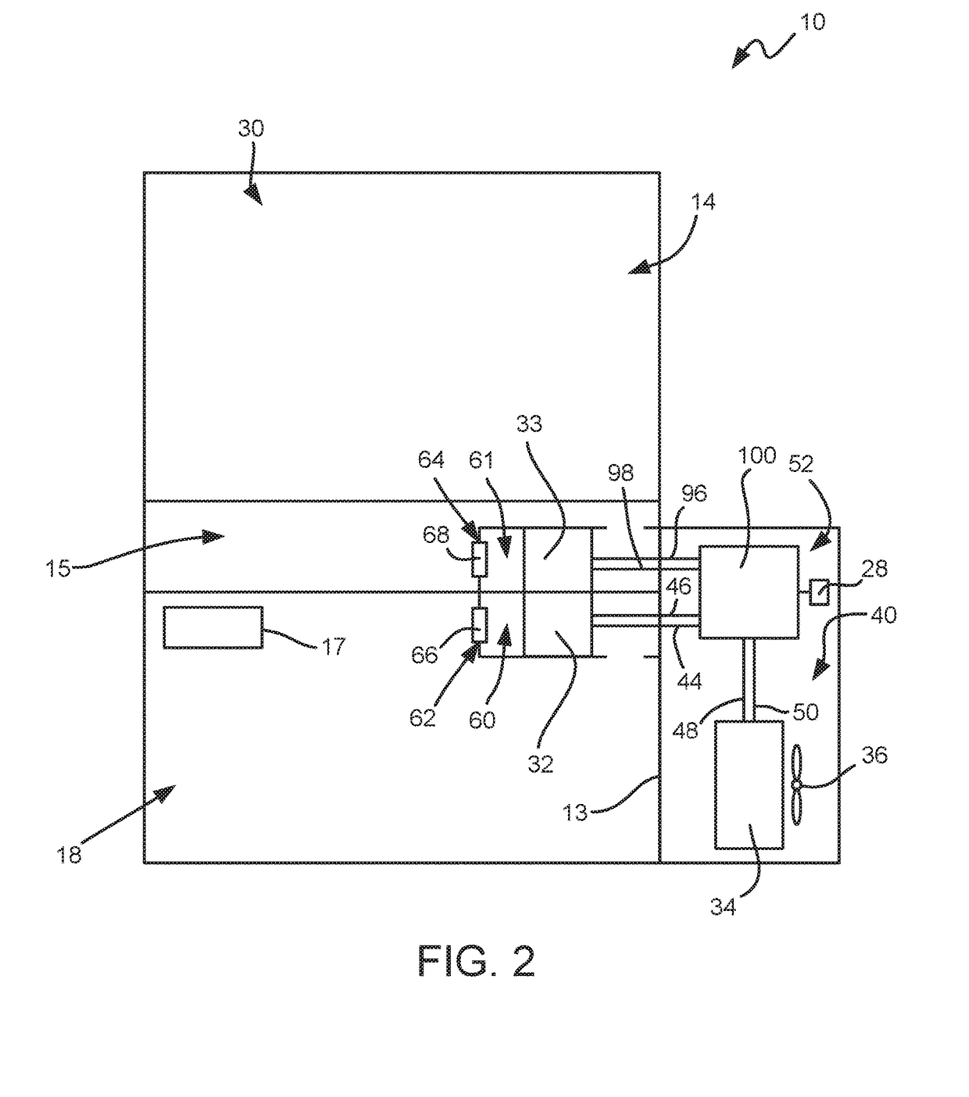
FIG. 2 is a schematic illustration of certain components of a heat pump system positioned in the example refrigerator appliance of FIG. 1.

FIG. 2 is a schematic view of various components of refrigerator appliance 10, including refrigeration compartments 30 (e.g., fresh-food compartments 14 and freezer compartment 18) and a machinery compartment 40. Refrigeration compartment 30 and machinery compartment 40 include a heat pump system 52 having a cold side heat exchanger 32 positioned in refrigeration compartments 30 for the removal of heat therefrom. A heat transfer fluid such as e.g., an aqueous solution, flowing within cold side heat exchanger 32 receives heat from refrigeration compartment 30 thereby cooling contents of refrigeration compartment 30. As an example, cold side heat exchanger 32 may be positioned at or adjacent freezer compartment 18, and air from cold side heat exchanger 32 may cool freezer compartment 18. In addition, the air from cold side heat exchanger 32 may also be circulated (e.g., with a fan) to fresh-food compartment 14 such that the air from cold side heat exchanger 32 cools fresh-food compartment 14.

The heat transfer fluid flows out of cold side heat exchanger 32 by line 44 to heat pump 100. As will be further described herein, the heat transfer fluid receives additional heat from magneto-caloric material (MCM) in heat pump 100 and carries this heat by line 48 to a first hot side heat exchanger 34. Heat is released to the environment, machinery compartment 40, and/or other location external to refrigeration compartment 30 using first hot side heat exchanger 34. A fan 36 may be used to create a flow of air across first hot side heat exchanger 34 and thereby improve the rate of heat transfer to the environment. A pump or pumps (not shown) cause the heat transfer fluid to recirculate in heat pump system 52. Motor 28 is in mechanical communication with heat pump 100 and is operable to provide relative motion between a field generator and a regenerator housing, as discussed in greater detail below.

From first hot side heat exchanger 34, the heat transfer fluid returns by line 50 to heat pump 100 where, as will be further described below, the heat transfer fluid loses heat to the MCM in heat pump 100. The now colder heat transfer fluid flows by line 46 to cold side heat exchanger 32 to receive heat from refrigeration compartment 30 and repeat the cycle as just described.

As may be seen in FIG. 2, heat pump system 52 also has a second hot side heat exchanger 33. Second hot side heat exchanger 33 operates in parallel with first hot side heat exchanger 34 to heat a portion of refrigerator appliance 10. For example, as shown in FIG. 2, second hot side heat exchanger 33 may be positioned within a deli drawer or defrost drawer 15 is separate from freezer compartment 18 and fresh-food compartment 14 and may be heated by second hot side heat exchanger 33 to a temperature different (e.g., greater) than freezer compartment 18 and fresh-food compartment 14. Thus, second hot side heat exchanger 33 may be utilized to heat a compartment other than freezer compartment 18 or fresh-food compartment 14. As another example, second hot side heat exchanger 33 may be positioned within casing 12 at an inner liner 13. In such a manner, second hot side heat exchanger 33 may be used to heat the inner liner 13 and reduce or prevent sweat/condensation formation on inner liner 13. In other example embodiments, second hot side heat exchanger 33 may be positioned on an ice maker 17. Thus, second hot side heat exchanger 33 may be used to heat ice maker 17, e.g., to assist with ice harvesting from ice maker 17. In alternative example embodiments, second hot side heat exchanger 33 may be positioned to heat water supplied to a dispenser on one of doors 16. In another example embodiments, second hot side heat exchanger 33 may be positioned on cold side heat exchanger 32. Thus, second hot side heat exchanger 33 may be used to defrost cold side heat exchanger 32. In alternative example embodiments, second hot side heat exchanger 33 may be positioned to heat water supplied to a dispenser on one of doors 16. As may be seen from the above, second hot side heat exchanger 33 may be positioned at a variety of locations within refrigerator appliance 10. Thus, the description provided herein is not intended to limit second hot side heat exchanger 33 to any particular location within refrigerator appliance 10 unless otherwise indicated.

The heat transfer fluid may flow to second hot side heat exchanger 33 in the manner described above for hot side heat exchanger 34. For example, heat transfer fluid flows by line 96 to second hot side heat exchanger 33 from heat pump 100, and heat transfer fluid flows by line 98 to heat pump 100 from second hot side heat exchanger 33. Heat pump system 52 is provided by way of example only. Other configurations of heat pump system 52 may be used as well. For example, lines 44, 46, 48, 50, 96, 98 provide fluid communication between the various components of heat pump system 52 but other heat transfer fluid recirculation loops with different lines and connections may also be employed. Still other configurations of heat pump system 52 may be used as well.

Refrigerator appliance 10 also includes features for regulating air flow across cold side heat exchanger 32 to freezer compartment 18 and across second hot side heat exchanger 33 to deli drawer 15. As may be seen in FIG. 2, cold side heat exchanger 32 is positioned within a first heat exchanger compartment 60 that is defined within cabinet 12. Freezer compartment 18 is contiguous with first heat exchanger compartment 60 through a freezer duct 62. Thus, air may flow between freezer compartment 18 and first heat exchanger compartment 60 via freezer duct 62. Second hot side heat exchanger 33 is positioned within a second heat exchanger compartment 61 that is defined within cabinet 12, e.g., between fresh-food compartments 14 and freezer compartment 18. An interior of deli drawer 15 is contiguous with second heat exchanger compartment 61 through a duct 64. Thus, air may flow between the interior of deli drawer 15 and second heat exchanger compartment 61 via duct 64. First heat exchanger compartment 61 may be separate from second heat exchanger compartment 61 within cabinet 12.

Refrigerator appliance 10 also includes a freezer fan 66 and a second fan 68. Freezer fan 66 may be positioned at or within freezer duct 62. Freezer fan 66 is operable to force air flow between freezer compartment 14 and first heat exchanger compartment 60 through freezer duct 62. Freezer fan 66 may thus be used to create a flow of air across cold side heat exchanger 32 and thereby improve the rate of heat transfer. Second fan 68 may be positioned at or within duct 64. Second fan 68 is operable to force air flow between the interior of deli drawer 15 and second heat exchanger compartment 61 through duct 64. Second fan 68 may thus be used to create a flow of air across second hot side heat exchanger 33 and thereby improve the rate of heat transfer.

Operation of heat pump system 52 and fresh food fan 66 allows chilled air from cold side heat exchanger 32 to cool freezer compartment 18, e.g., to about negative ten degrees Fahrenheit (−10° F.). Similarly, operation of heat pump system 52 and freezer fan 68 allows second hot side heat exchanger 33 to heat deli drawer 15 (or another component of refrigerator appliance 10, such as cold side heat exchanger 32, inner liner 13, ice maker 17, etc.). Thus, cold side heat exchanger 32 may chill freezer compartment 18 and second hot side heat exchanger 33 may heat a portion of refrigerator appliance 10 during operation of heat pump system 52.

Figure 3:
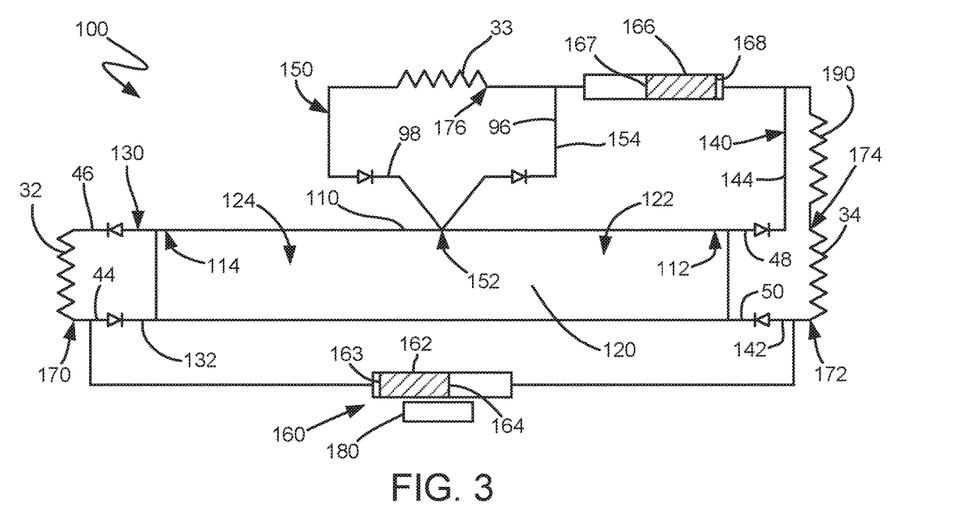
FIGS. 3 and 4 provide schematic views of a heat pump of the example heat pump system of FIG. 2.
Figure 4:
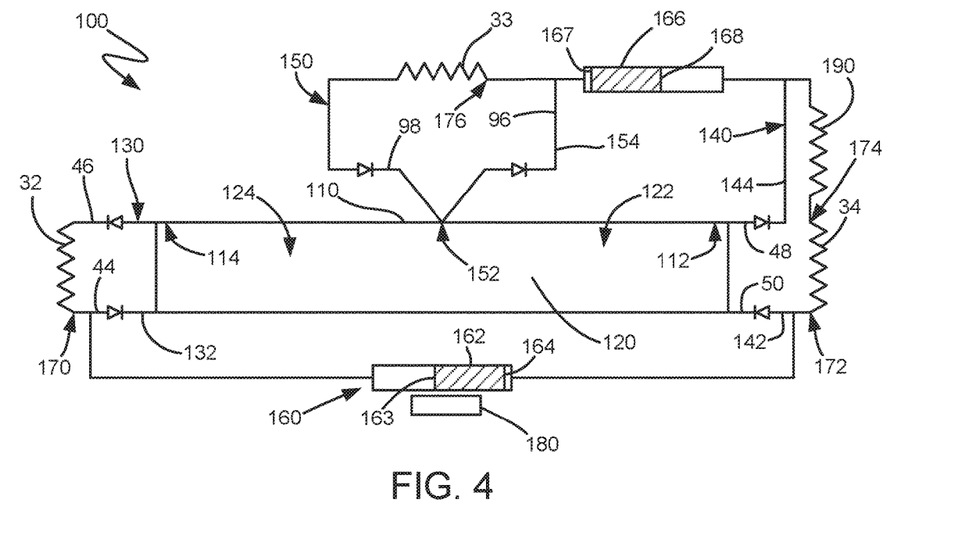

FIGS. 3 and 4 illustrate an example heat pump 100 and components thereof, and the use of heat pump 100 with heat pump system 52, in accordance with example embodiments of the present disclosure. Heat pump 100 shown in FIGS. 3 and 4 may be suitable for use within a linear reciprocating caloric heat pump. Thus, it will be understood that the present subject matter may be used in or with any suitable heat pump, including linear caloric heat pumps. However, the example heat pumps 100 provided herein are not intended to limit the present subject matter to the particular heat pump arrangement of FIGS. 3 and 4.

As may be seen in FIGS. 3 and 4, heat pump 100 includes a regenerator housing 110. Regenerator housing 110 extends between a first end portion 112 and a second end portion 114. A caloric material 120 is disposed within regenerator housing 110. Caloric material 120 may extend between first and second end portions 112, 114 within regenerator housing 110. In particular, caloric material 120 has a first portion 122 and a second portion 124. First portion 122 of caloric material 120 is disposed within regenerator housing 110 at or adjacent first end portion 112 of regenerator housing 110, and second portion 124 of caloric material 120 is disposed within regenerator housing 110 at or adjacent second end portion 114 of regenerator housing 110. Thus, first and second portions 122, 124 of caloric material 120 may be positioned at opposite ends of regenerator housing 110. It will be understood that caloric material 120 may include other portions between first and second portions 122, 124 of caloric material 120.

Caloric material 120 may be any suitable type or combination of caloric material. For example, caloric material 120 may be a caloric material or cascade of caloric materials selected (and/or sized) to suitably cool working fluid supplied to cold side heat exchanger 32 to a temperature suitable for cooling freezer compartment 18 to a set temperature of freezer compartment 18, e.g., about zero degrees Fahrenheit (0° F.). In addition, caloric material 120 in combination with cold side heat exchanger 32 may be configured such that a temperate span of the working fluid is between about negative ten degrees Fahrenheit (−10° F.) and one hundred and five degrees Fahrenheit (105° F.). First and second portions 122, 124 of caloric material 120 may include common or different caloric materials, and first and second portions 122, 124 of caloric material 120 may have different sizes (e.g., cross-sectional areas and/or lengths).

A cold side working fluid circuit 130 couples cold side heat exchanger 32 and regenerator housing 110. Within cold side working fluid circuit 130, working fluid is flowable between cold side heat exchanger 32 and regenerator housing 110. Cold side working fluid circuit 130 may include lines 44, 46 for connecting cold side heat exchanger 32 with regenerator housing 110. As shown in FIGS. 3 and 4, cold side working fluid circuit 130 includes check valves (not labeled) that regulate the direction of the flow of the first working fluid through cold side working fluid circuit 130, e.g., to a single direction within cold side working fluid circuit 130.

A first hot side working fluid circuit 140 couples first hot side heat exchanger 34 and regenerator housing 110. Within first hot side working fluid circuit 140, working fluid is flowable between first hot side heat exchanger 34 and regenerator housing 110. First hot side working fluid circuit 140 may include lines 48, 50 for connecting first hot side heat exchanger 34 with regenerator housing 110. As shown in FIGS. 3 and 4, first hot side working fluid circuit 140 includes check valves (not labeled) that regulate the direction of the flow of the first working fluid through first hot side working fluid circuit 140, e.g., to a single direction within first hot side working fluid circuit 140.

A second hot side working fluid circuit 150 couples second hot side heat exchanger 33 and regenerator housing 110. Within second hot side working fluid circuit 150, working fluid is flowable between second hot side heat exchanger 33 and regenerator housing 110. Second hot side working fluid circuit 150 may include lines 96, 98 for connecting second hot side heat exchanger 33 with regenerator housing 110. As shown in FIGS. 3 and 4, second hot side working fluid circuit 150 includes check valves (not labeled) that regulate the direction of the flow of the first working fluid through second hot side working fluid circuit 150, e.g., to a single direction within second hot side working fluid circuit 150.

A pump 160 is connected to cold side working fluid circuit 130, first hot side working fluid circuit 140 and second hot side working fluid circuit 150. Pump 160 is operable to flow working fluid through cold side working fluid circuit 130, first hot side working fluid circuit 140 and second hot side working fluid circuit 150. Thus, a single pump 160 may flow working fluid through three (or more) fluid circuits within heat pump system 52.

An inlet 152 of second hot side working fluid circuit 150 is positioned on regenerator housing 110, e.g., between first and second end portions 112, 114 of regenerator housing 110. Thus, working fluid may flow between regenerator housing 110 and second hot side working fluid circuit 150 during operation of pump 160. Inlet 152 of second hot side working fluid circuit 150 is positioned on regenerator housing 110 such that a temperature of working fluid at inlet 152 of second hot side working fluid circuit 150 is greater than a temperature of fresh-food compartment 14. Such relatively hot heating fluid may be used to heat desired portions of refrigerator appliance 10 at second hot side working fluid circuit 150, as described above. In particular, such placement of inlet 152 of second hot side working fluid circuit 150 may allow sweat prevention on inner liner 15, defrosting of cold side heat exchanger 32, ice harvesting in ice maker 17, etc. with second hot side working fluid circuit 150.

As shown in FIGS. 3 and 4, pump 160 may include a first piston set 162 and a second piston set 166. First and second piston sets 162, 166 are synchronized, e.g., such that first and second piston sets 162, 166 oppositely draw or fill with working fluid within working fluid circuits 130, 140, 150. Thus, a system volume within working fluid circuits 130, 140, 150 may be maintained with first and second piston sets 162, 166.

Cold side working fluid circuit 130 includes a cold side outlet conduit 132. Cold side outlet conduit 132 extends between an outlet 170 of cold side heat exchanger 32 and regenerator housing 110. Similarly, first hot side working fluid circuit 140 includes an outlet conduit 142. First hot side outlet conduit 142 extends between an outlet 172 of first hot side heat exchanger 34 and regenerator housing 110. First piston set 162 may be coupled to cold side outlet conduit 132 and first hot side outlet conduit 142. In particular, first piston set 162 has a first piston head 163 and a second piston head 164. First piston head 163 of first piston set 162 is in fluid communication with cold side outlet conduit 132. Conversely, second piston head 164 of first piston set 162 is in fluid communication with outlet conduit 142 of first hot side working fluid circuit 140. First and second piston heads 163, 164 of first piston set 162 reciprocate to flow working fluid through cold side working fluid circuit 130 and first hot side working fluid circuit 140. In particular, the working fluid within cold side working fluid circuit 130 is urged through cold side working fluid circuit 130 by first piston head 163 of first piston set 162, and the working fluid within first hot side working fluid circuit 140 is urged through first hot side working fluid circuit 140 by second piston head 164 of first piston set 162. First and second piston heads 163, 164 of first piston set 162 may be synchronized to oppositely reciprocate. Thus, e.g., the expansion and suction strokes of first and second piston heads 163, 164 of first piston set 162 may be opposite each other.

First hot side working fluid circuit 140 also includes an inlet conduit 144. Inlet conduit 144 of first hot side working fluid circuit 140 extends between regenerator housing 110 and an inlet 174 of first hot side heat exchanger 34. Similarly, second hot side working fluid circuit 150 also includes an inlet conduit 154. Inlet conduit 154 of second hot side working fluid circuit 150 extends between regenerator housing 110 and an inlet 176 of second hot side heat exchanger 33. Second piston set 166 may be coupled to inlet conduit 144 of first hot side working fluid circuit 140 and inlet conduit 154 of second hot side working fluid circuit 150. In particular, second piston set 166 has a first piston head 167 and a second piston head 168. First piston head 167 of second piston set 166 is in fluid communication with inlet conduit 144 of first hot side working fluid circuit 140. Conversely, second piston head 168 of second piston set 166 is in fluid communication with inlet conduit 154 of second hot side working fluid circuit 150. First and second piston heads 167, 168 of second piston set 166 reciprocate to flow working fluid through first and second hot side working fluid circuits 140, 150. In particular, the working fluid within first hot side working fluid circuit 140 is urged through first hot side working fluid circuit 140 by first piston head 167 of first piston set 166, and the working fluid within second hot side working fluid circuit 150 is urged through second hot side working fluid circuit 150 by second piston head 168 of second piston set 166. First and second piston heads 167, 168 of second piston set 166 may be synchronized to oppositely reciprocate. Thus, e.g., the expansion and suction strokes of first and second piston heads 167, 168 of second piston set 166 may be opposite each other.

Pump 160 may be powered with a motor 180. As shown in FIGS. 3 and 4, motor 180 may be coupled to first piston set 162, and motor 180 may reciprocate first and second piston heads 163, 164 of first piston set 162 to flow the working fluid through cold side working fluid circuit 130 and second hot side working fluid circuit 140. Conversely, in FIGS. 3 and 4, motor 180 is not coupled to second piston set 166, and second piston set 166 is unpowered. Thus, first and second piston heads 167, 168 of second piston set 166 may reciprocate due to working fluid flow within first and second working fluid circuits 140, 150 in order to maintain system volume during operation of motor 180 to reciprocate first and second piston heads 163, 164 of first piston set 162. In alternative example embodiments, second piston set 166 may be powered by motor 180, and first piston set 162 may be unpowered by motor 180. In other alternative example embodiments, both first and second piston sets 162, 166 may be powered by motor 180 (or separate motors).

As shown in FIGS. 3 and 4, a third hot side heat exchanger 190 may be coupled to first hot side working fluid circuit 140. Thus, third hot side heat exchanger 190 may operate in series with first hot side heat exchanger 34. Third hot side heat exchanger 190 may be positioned at inner liner 15 of casing 12. Thus, third hot side heat exchanger 190 may be configured to reduce sweat on inner liner 15 during operation of heat pump 100, e.g., by heating inner liner 15 relative to air within casing 12. It will be understood that heat pump system 52 may include any suitable number of hot side heat exchangers in alternative example embodiments, and each hot side heat exchanger may be configured to heat a respective portion of refrigerator appliance 10 during operation of heat pump 100.

Figure 5:
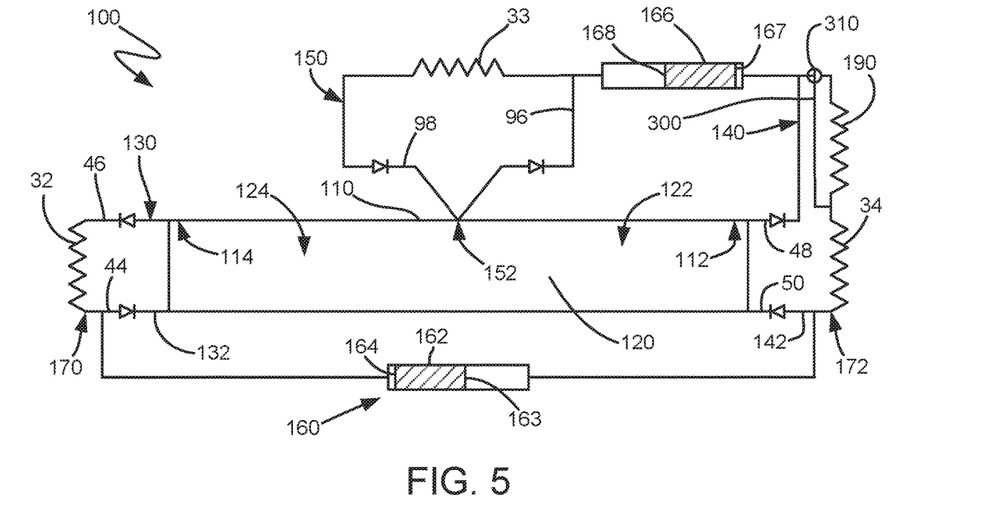
FIGS. 5 and 6 provide schematic views of a heat pump of the example heat pump system of FIG. 2.
Figure 6:
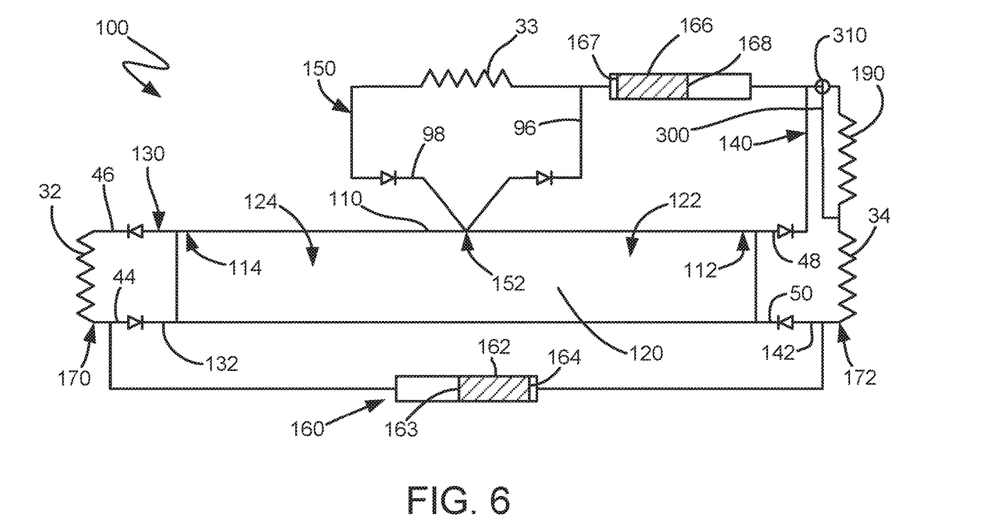

FIGS. 5 and 6 provide schematic views of heat pump 100 according to another example embodiment of the present subject matter. In FIGS. 5 and 6, heat pump 100 includes common components with and operates in a similar manner to that described above in the context of FIGS. 3 and 4. However, as may be seen in FIGS. 5 and 6, a bypass conduit 300 extends around third hot side heat exchanger 190 on line 48. A bypass valve 310 is coupled to bypass conduit 300 and/or line 48. In a bypass configuration, bypass valve 310 allows working fluid to flow around third hot side heat exchanger 190 through bypass conduit 300. Conversely, bypass valve 310 blocks working fluid from flowing through bypass conduit 300 around third hot side heat exchanger 190 when in a normal configuration. Bypass valve 310 may be a three-way valve or any other suitable mechanism for selectively directing working fluid within first hot side working fluid circuit 140 around third hot side heat exchanger 190. Thus, third hot side heat exchanger 190 may be selectively operated in the example embodiment shown in FIGS. 5 and 6 in contrast to the example embodiment shown in FIGS. 3 and 4 where working fluid always flows through third hot side heat exchanger 190 during operation of heat pump 100.

Figure 7:
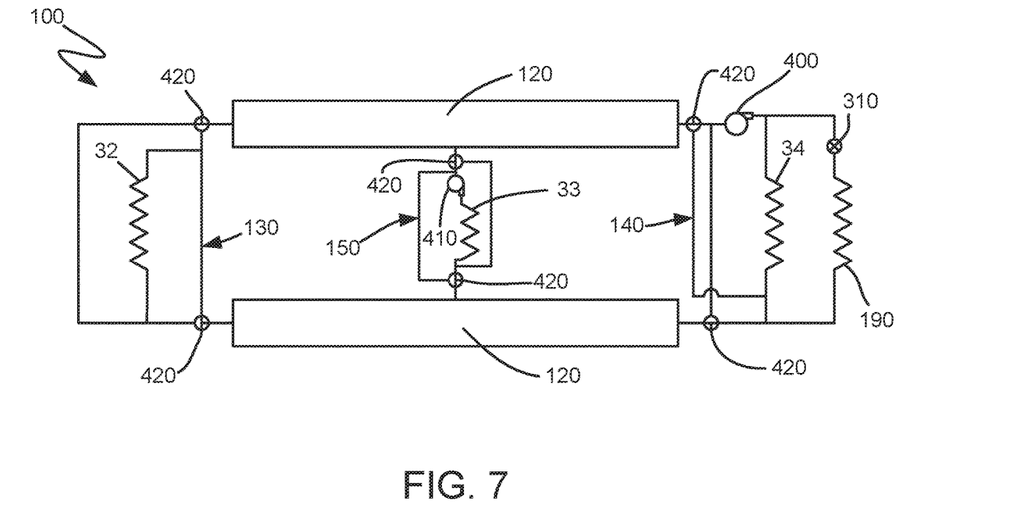
FIGS. 7 and 8 provide schematic views of a heat pump of the example heat pump system of FIG. 2.
Figure 8:
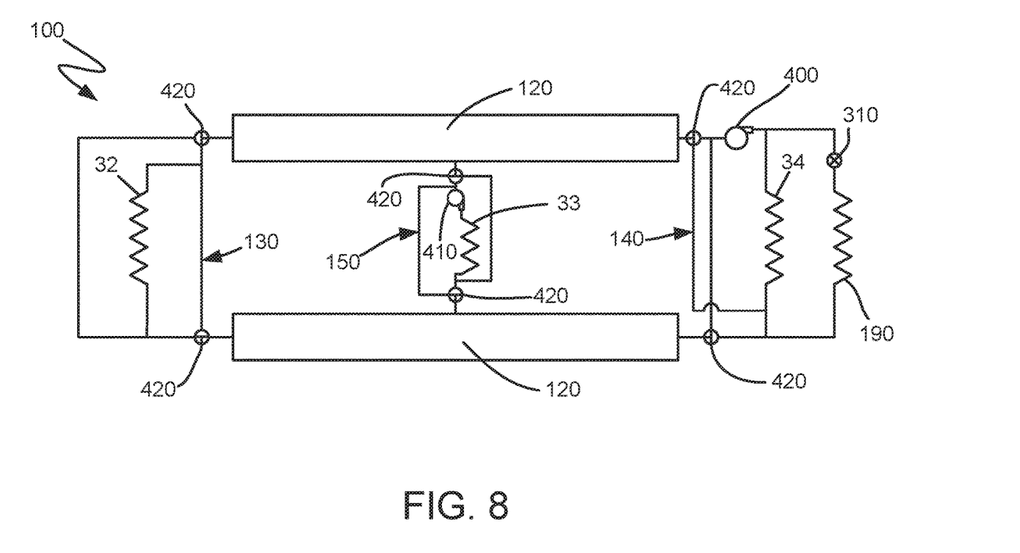

FIGS. 7 and 8 provide schematic views of heat pump 100 according to an additional example embodiment of the present subject matter. In FIGS. 7 and 8, heat pump 100 includes a first pump 400 and a second pump 410 rather than pump 160. First and second pumps 400, 410 are steady state pumps, e.g., with motor driven impellers, that continuously circulate the working fluid within heat pump system 52. Six three-way valves 420 allow first and second pumps 400, 410 to flow working fluid through heat pump 100. Two three-way valves 420 are provided on each of cold side working fluid circuit 130, first hot side working fluid circuit 140 and second hot side working fluid circuit 150. Thus, e.g., three-way valves 420 may be shifted between the configurations shown in FIGS. 7 and 8 to circulate the working fluid within heat pump system 52 with first and second pumps 400, 410.

Figure 9:
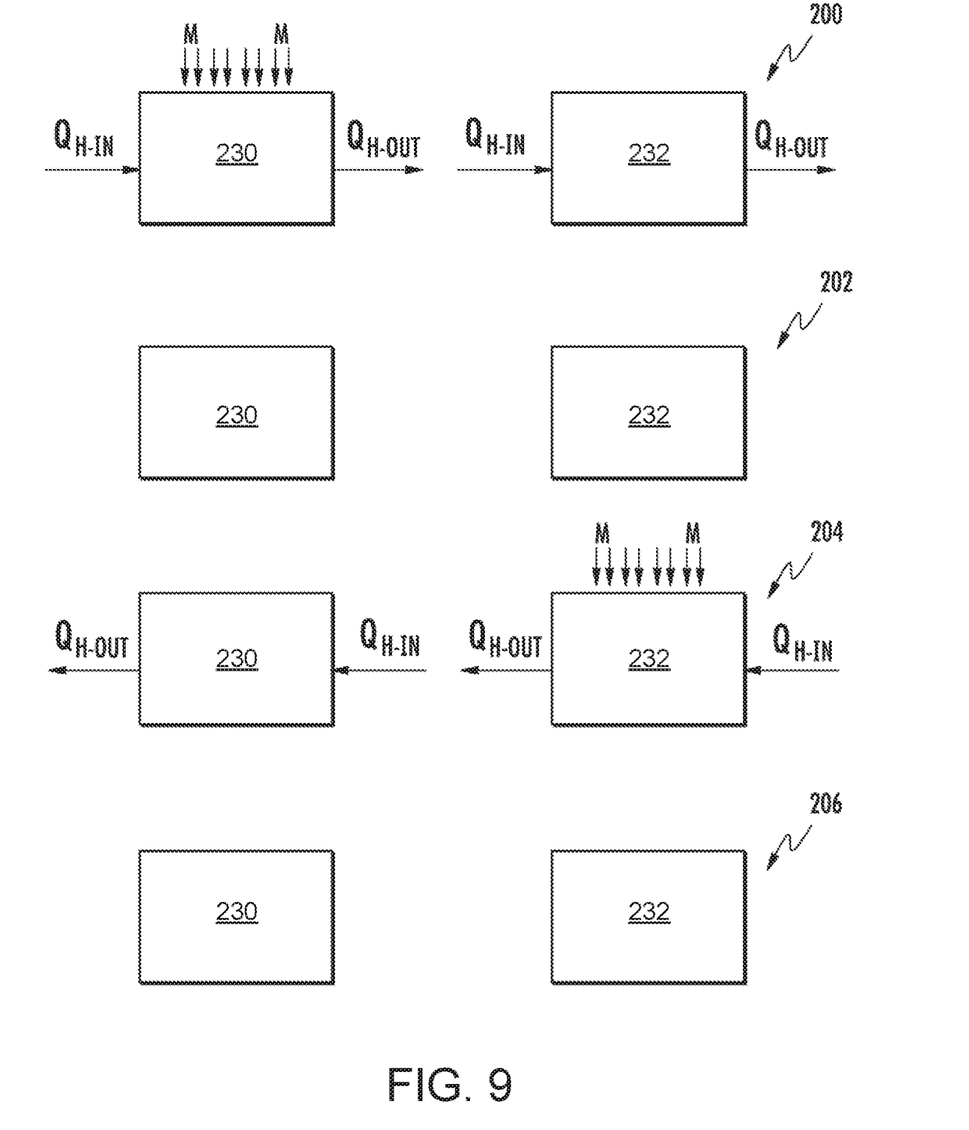
FIG. 9 is a schematic diagram illustrating various positions and movements there-between of MCM stages in accordance with an exemplary embodiment of the present disclosure.

FIG. 9 illustrates an exemplary method of the present disclosure using a schematic representation of associated stages 230, 232 of MCM during dwelling in and movement between the various positions as discussed herein. With regard to first stage 230, during step 200, which corresponds to the first position, stage 230 is fully within magnetic field M, which causes the magnetic moments of the material to orient and the MCM to heat as part of the magneto caloric effect. Further, pump 170 is activated to actively flow working fluid. As indicated by arrow $Q_{H-OUT}$, working fluid in stage 230, now heated by the MCM, can travel out of stage 230 and along line 48 to first hot side heat exchanger 34. At the same time, and as indicated by arrow $Q_{H-IN}$, working fluid from cold side heat exchanger 32 flows into stage 230 from line 44. Because working fluid from cold side heat exchanger 32 is relatively cooler than the MCM in stage 230, the MCM will lose heat to the working fluid.

In step 202, stage 230 is moved from the first position to the second position in the first transition. During the time in the first transition, working fluid dwells in the MCM of stage 230. More specifically, the working fluid does not actively flow through stage 230.

In step 204, stage 230 is in the second position and thus out of magnetic field M. The absence or lessening of the magnetic field is such that the magnetic moments of the material become disordered and the MCM absorbs heat as part of the magnetocaloric effect. Further, pump 172 is activated to actively flow working fluid. As indicated by arrow $Q_{C-OUT}$, working fluid in stage 230, now cooled by the MCM, can travel out of stage 230 and along line 46 to cold side heat exchanger 32. At the same time, and as indicated by arrow $Q_{C-IN}$, working fluid from first hot side heat exchanger 34 flows into stage 112 from line 50 when stage 230 is in the second transition. Because working fluid from first hot side heat exchanger 34 is relatively warmer than the MCM in stage 230, the MCM will lose some of its heat to the working fluid. The working fluid now travels along line 46 to cold side heat exchanger 32 to receive heat and cool refrigeration compartment 30.

In step 206, stage 230 is moved from the second position to the first position in the second transition. During the time in the second transition, the working fluid dwells in the MCM of stage 230. More specifically, the working fluid does not actively flow through stage 230.

With regard to second stage 232, during step 200, which corresponds to the first position, second stage 232 is out of magnetic field M. The absence or lessening of the magnetic field is such that the magnetic moments of the material become disordered and the MCM absorbs heat as part of the magneto-caloric effect. Further, pump 170 is activated to actively flow working fluid. As indicated by arrow $Q_{C-OUT}$, working fluid in stage 232, now cooled by the MCM, can travel out of stage 232 and along line 46 to cold side heat exchanger 32. At the same time, and as indicated by arrow $Q_{C-IN}$, working fluid from first hot side heat exchanger 34 flows into stage 112 from line 50 when stage 232 is in the second transition. Because working fluid from first hot side heat exchanger 34 is relatively warmer than the MCM in stage 232, the MCM will lose some of its heat to the working fluid. The working fluid now travels along line 46 to cold side heat exchanger 32 to receive heat and cool the refrigeration compartment 30.

In step 202, stage 232 is moved from the first position to the second position in the first transition. During the time in the first transition, the working fluid dwells in the MCM of stage 232. More specifically, the working fluid does not actively flow through stage 232.

In step 204, stage 232 is in the second position and thus fully within magnetic field M, which causes the magnetic moments of the material to orient and the MCM to heat as part of the magneto caloric effect. Further, pump 172 is activated to actively flow working fluid. As indicated by arrow $Q_{H\text{-}OUT}$, working fluid in stage 232, now heated by the MCM, can travel out of stage 232 and along line 48 to first hot side heat exchanger 34. At the same time, and as indicated by arrow $Q_{H\text{-}IN}$, working fluid from cold side heat exchanger 32 flows into stage 232 from line 44. Because working fluid from cold side heat exchanger 32 is relatively cooler than the MCM in stage 232, the MCM will lose heat to the working fluid.

In step 206, stage 232 is moved from the second position to the first position in the second transition. During the time in the second transition, working fluid dwells in the MCM of stage 232. More specifically, the working fluid does not actively flow through stage 232.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A refrigerator appliance, comprising:
    a cabinet defining a chilled chamber;
    a first hot side heat exchanger positioned outside of the chilled chamber of the cabinet;
    a second hot side heat exchanger;
    a cold side heat exchanger positioned within the cabinet at the chilled chamber, the chilled chamber chillable with air from the cold side heat exchanger;
    a regenerator housing;
    a caloric material disposed within the regenerator housing;
    a cold side working fluid circuit coupling the cold side heat exchanger and the regenerator housing such that working fluid is flowable between the cold side heat exchanger and the regenerator housing; and
    a first hot side working fluid circuit coupling the first hot side heat exchanger and the regenerator housing such that working fluid is flowable between the first hot side heat exchanger and the regenerator housing;
    a second hot side working fluid circuit coupling the second hot side heat exchanger and the regenerator housing such that working fluid is flowable between the second hot side heat exchanger and the regenerator housing; and
    a pump connected to the cold side working fluid circuit, the first hot side fluid circuit and the second hot side fluid circuit, the pump operable to flow the working fluid through the cold side working fluid circuit, the first hot side fluid circuit and the second hot side fluid circuit,
    wherein an inlet of the second hot side working fluid circuit is positioned on the regenerator housing such that a temperature of the working fluid at the inlet of the second hot side working fluid circuit is greater than a temperature of the chilled chamber,
    wherein the cold side working fluid circuit comprises an outlet conduit that extends between an outlet of the cold side heat exchanger and the regenerator housing, the first hot side working fluid circuit comprising an outlet conduit that extends between an outlet of the first hot side heat exchanger and the regenerator housing, the pump comprising a first piston set with a first piston head and a second piston head, the first piston head of the first piston set in fluid communication with the outlet conduit of the cold side working fluid circuit, the second piston head of the first piston set in fluid communication with the outlet conduit of the first hot side fluid circuit, and
    wherein the first hot side working fluid circuit comprises an inlet conduit that extends between the regenerator housing and an inlet of the first hot side heat exchanger, the second hot side working fluid circuit comprises an inlet conduit that extends between the regenerator housing and an inlet of the second hot side heat exchanger, the pump comprising a second piston set with a first piston head and a second piston head, the first piston head of the second piston set in fluid communication with the second hot side fluid circuit, the second piston head of the second piston set in fluid communication with the inlet conduit of the second hot side fluid circuit.

2. The refrigerator appliance of claim 1, wherein the first hot side heat exchanger is positioned in a mechanical compartment of the cabinet.

3. The refrigerator appliance of claim 1, wherein the second hot side heat exchanger is positioned at an inner liner of the cabinet and is configured to reduce sweat on the inner liner of the cabinet.

4. The refrigerator appliance of claim 1, wherein the second hot side heat exchanger is positioned adjacent the cold side heat exchanger and is configured for defrosting the cold side heat exchanger.

5. The refrigerator appliance of claim 1, wherein the second hot side heat exchanger is positioned at a drawer positioned within the cabinet, the second hot side heat exchanger configured for heating an interior volume of the drawer.

6. The refrigerator appliance of claim 1, wherein the second hot side heat exchanger is positioned at an ice maker, the second hot side heat exchanger configured for heating the ice maker.

7. The refrigerator appliance of claim 1, further comprising a third hot side heat exchanger coupled to the first hot side working fluid circuit, the third hot side heat exchanger positioned at an inner liner of the cabinet and configured to reduce sweat on the inner liner of the cabinet.

8. A refrigerator appliance, comprising:
    a cabinet defining a chilled chamber;
    a first hot side heat exchanger positioned outside of the chilled chamber of the cabinet;
    a. second hot side heat exchanger;
    a third hot side heat exchanger;
    a cold side heat exchanger positioned within the cabinet at the chilled chamber, the chilled chamber chillable with air from the cold side heat exchanger;
    a regenerator housing;
    a caloric material disposed within the regenerator housing;
    a cold side working fluid circuit coupling the cold side heat exchanger and the regenerator housing such that working fluid is flowable between the cold side heat exchanger and the regenerator housing; and a first hot side working fluid circuit coupling the first hot side heat exchanger and the regenerator housing such that working fluid is flowable between the first hot side heat exchanger and the regenerator housing; and a second hot side working fluid circuit coupling the second hot side heat exchanger and the regenerator housing such that working fluid is flowable between the second hot side heat exchanger and the regenerator housing, wherein an inlet of the second hot side working fluid circuit is positioned on the regenerator housing such that a temperature of the working fluid at the inlet of the second hot side working fluid circuit is greater than a temperature of the chilled chamber, wherein the third hot side heat exchanger is coupled to the first hot side working fluid circuit, the third hot side heat exchanger positioned at an inner liner of the cabinet, and wherein the second hot side heat exchanger is positioned at an ice maker, the second hot side heat exchanger configured for heating the ice maker.

9. The refrigerator appliance of claim 8, wherein the first hot side heat exchanger is positioned in a mechanical compartment of the cabinet.

10. The refrigerator appliance of claim 8, further comprising a pump connected to the cold side working fluid circuit, the first hot side fluid circuit and the second hot side fluid circuit, the pump operable to flow the working fluid through the cold side working fluid circuit, the first hot side fluid circuit and the second hot side fluid circuit.

11. The refrigerator appliance of claim 10, wherein the cold side working fluid circuit comprises an outlet conduit that extends between an outlet of the cold side heat exchanger and the regenerator housing, the first hot side working fluid circuit comprising an outlet conduit that extends between an outlet of the first hot side heat exchanger and the regenerator housing, the pump comprising a first piston set with a first piston head and a second piston head, the first piston head of the first piston set in fluid communication with the outlet conduit of the cold side working fluid circuit, the second piston head of the first piston set in fluid communication with the outlet conduit of the first hot side fluid circuit.

12. The refrigerator appliance of claim 11, wherein the first hot side working fluid circuit comprises an inlet conduit that extends between the regenerator housing and an inlet of the first hot side heat exchanger, the second hot side working fluid circuit comprises an inlet conduit that extends between the regenerator housing and an inlet of the second hot side heat exchanger, the pump comprising a second piston set with a first piston head and a second piston head, the first piston head of the second piston set in fluid communication with the second hot side fluid circuit, the second piston head of the second piston set in fluid communication with the inlet conduit of the second hot side fluid circuit.

13. The refrigerator appliance of claim 8, wherein the second hot side heat exchanger is positioned adjacent the cold side heat exchanger and is configured for defrosting the cold side heat exchanger.

14. The refrigerator appliance of claim 8, wherein the second hot side heat exchanger is positioned at a drawer positioned within the cabinet, the second hot side heat exchanger configured for heating an interior volume of the drawer.

* * * * *